(12) United States Patent
DeBoer et al.

(10) Patent No.: US 6,461,982 B2
(45) Date of Patent: *Oct. 8, 2002

(54) METHODS FOR FORMING A DIELECTRIC FILM

(75) Inventors: Scott J. DeBoer, Boise, ID (US); Randhir P. S. Thakur, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/807,831

(22) Filed: Feb. 27, 1997

(65) Prior Publication Data

US 2001/0036752 A1 Nov. 1, 2001

(51) Int. Cl.$^7$ .............................................. H01L 21/469
(52) U.S. Cl. ........................ 438/778; 438/240; 438/591; 438/771; 438/785
(58) Field of Search ................................. 438/240, 778, 438/485, 3, 785, 591, 287, 771

(56) References Cited

U.S. PATENT DOCUMENTS

| | | | |
|---|---|---|---|
| 4,691,662 A | | 9/1987 | Roppel et al. |
| 5,261,961 A | | 11/1993 | Takasu et al. |
| 5,312,783 A | * | 5/1994 | Takasaki et al. ............ 438/785 |
| 5,525,156 A | | 6/1996 | Manada et al. |
| 5,702,562 A | | 12/1997 | Wakahara |

* cited by examiner

Primary Examiner—Chandra Chaudhari
Assistant Examiner—Jack S. J. Chen
(74) Attorney, Agent, or Firm—Mueting, Raasch & Gebhardt, P.A.

(57) ABSTRACT

A method of forming a high dielectric oxide film includes forming a high dielectric oxide film on a surface. The high dielectric oxide film has a dielectric constant greater than about 4 and includes a plurality of oxygen vacancies present during the formation of the film. The high dielectric oxide film is exposed during the formation thereof to an amount of atomic oxygen sufficient for reducing the number of oxygen vacancies. Further, the amount of atomic oxygen used in the formation method may be controlled as a function of the amount of oxygen incorporated into the high dielectric oxide film during the formation thereof or be controlled as a function of the concentration of atomic oxygen in a process chamber in which the high dielectric oxide film is being formed. An apparatus for forming the high dielectric oxide film is also described.

16 Claims, 5 Drawing Sheets

METHODS FOR FORMING A DIELECTRIC FILM

FIELD OF THE INVENTION

The present invention pertains to high dielectric constant films. More particularly, the present invention relates to methods and apparatus for forming high dielectric constant films utilizing the incorporation of atomic oxygen during the formation of such films.

BACKGROUND OF THE INVENTION

Various dielectric films have been formed in the past during the fabrication of semiconductor devices. For example, films such as silicon dioxide and silicon nitride have been used for dielectric films in the formation of capacitors, such as for memory devices, including dynamic random access memories and static random access memories. Such films typically have small leakage currents associated therewith.

With the shrinkage of minimum feature sizes of semiconductor devices, the requirement of providing high capacitance with thinner films is becoming apparent. As the dielectric constant of silicon dioxide and silicon nitride are relatively low, the need for utilizing higher dielectric constant films, such as tantalum pentoxide ($Ta_2O_5$), strontium titanate oxide ($SrTiO_3$), and barium strontium titanate ($Ba_xSr_{1-x}TiO_3$) arises. Such high dielectric films provide the ability to achieve a larger capacitance value in a smaller area, i.e., with a thinner dielectric film.

However, conventional deposition processes for forming such high dielectric constant films result in films having leakage current levels that are unacceptable for semiconductor devices being fabricated. As described in the article entitled, "Leakage Current Mechanisms of Amorphous and Polycrystalline $Ta_2O_5$ Films Grown by Chemical Vapor Deposition," by Aoyama et al., *J. Electrochem. Soc.*, Vol. 143, No. 3, March 1996, various treatments have been carried out after $Ta_2O_5$ film deposition to reduce the leakage current thereof. For example, such treatments described included dry $O_2$ treatment, dry $O_3$ treatment, $O_2$ treatment with utilization of ultraviolet exposure, $O_3$ treatment with use of ultraviolet exposure, and $N_2O$ plasma treatment. The results from the paper indicate that the presence of impurities, such as carbon and hydrogen, remaining in the $Ta_2O_5$ film leads to generally high leakage current and that oxidation of such impurities results in the reduction of the leakage current. However, post-deposition oxidation of such impurities results in a fabrication step generally not applicable to other dielectric films such as silicon dioxide and silicon nitride. Such post-deposition oxidation of high dielectric films, hereinafter referred to generally as post-deposition oxygen anneal, in addition to reducing throughput of devices also increases the thermal budget for fabrication of the devices.

Therefore, there is a need in the art for high dielectric oxide film formation methods and apparatus for forming high dielectric films, reducing throughput of devices by eliminating steps in the deposition process. The present invention provides such methods and apparatus for overcoming the problems as described above and other problems that will be readily apparent to one skilled in the art from the description of the present invention below.

SUMMARY OF THE INVENTION

A method of forming a high dielectric oxide film conventionally formed using a post-formation oxygen anneal to reduce the leakage current of such film is described. The method in accordance with the present invention includes forming a high dielectric oxide film on a surface. The high dielectric oxide film has a dielectric constant greater than about 4. The high dielectric oxide film includes a plurality of oxygen vacancies as the film is formed. The high dielectric oxide film is exposed to an amount of atomic oxygen during formation thereof sufficient for reducing the number of oxygen vacancies and eliminating the post-formation oxygen anneal of the formed high dielectric oxide film.

In one embodiment of the method, the amount of atomic oxygen to which the high dielectric oxide film is exposed during formation thereof is controlled as a function of the amount of oxygen incorporated into the high dielectric oxide film. In another embodiment of the method, the amount of atomic oxygen is controlled as a function of the concentration of atomic oxygen in a process chamber used for formation of the high dielectric oxide film.

In other embodiments of the method, the atomic oxygen is provided by at least one of $O_3$, NO, and $N_2O$. Further, the atomic oxygen may be provided by generation of a plasma from at least one of $O_3$, NO, $N_2O$, or $O_2$. Ionized atomic oxygen generated by the plasma may be attracted to the surface for incorporation in the high dielectric oxide film by biasing the surface. Further, the plasma may be generated remotely of the surface upon which the high dielectric film is formed or in proximity to the surface.

In other embodiments of the method, the high dielectric film may include $Ta_2O_5$, $Ba_xSr_{1-x}TiO_3$, $Y_2O_3$, $TiO_2$, $HfO_2$, PZT, PLZT, or SBT. Further, the atomic oxygen utilized for exposing the high dielectric oxide film may be exposed to a heat source.

In another method of forming a dielectric film in the fabrication of semiconductor devices, an amount of atomic oxygen for use in the formation of the film on a surface is provided. The high dielectric oxide film has a dielectric constant greater than about 4. A vaporized precursor is also provided for use in the formation of the film. The high dielectric oxide film is then formed using the atomic oxygen and the vaporized precursor. The amount of atomic oxygen is controlled as a function of the amount of atomic oxygen necessary to reduce the leakage current levels to below a predetermined level.

In another method of forming a dielectric film in the fabrication of semiconductor devices, atomic oxygen is provided for use in the formation of a $Ta_2O_5$ film on a surface. A vaporized tantalum precursor is also provided for forming the film. The $Ta_2O_5$ film is formed using the atomic oxygen and the vaporized tantalum precursor while simultaneously performing an in situ oxygen anneal of the film. In one embodiment of this method, the precursor is a carbon-free solid precursor.

An apparatus for forming a high dielectric oxide film in accordance with the present invention is also described. The apparatus includes a controllable atomic oxygen source and a vaporized precursor source. A deposition chamber for receiving the atomic oxygen from the atomic oxygen source and vaporized precursor from the vaporized precursor source is utilized for locating a structure therein for deposition of the high dielectric oxide film on a surface thereof. The high dielectric oxide film has a dielectric constant greater than about 4. The apparatus further includes a detection mechanism for detecting a characteristic of the deposition of the high dielectric oxide film on the surface of the structure. The controllable atomic oxygen source is controlled as a function of the detected characteristic.

Further, in accordance with the present invention, a high dielectric oxide film is provided. The high dielectric oxide film includes one of $Ta_2O_5$, $Ba_xSr_{1-x}TiO_3$, $Y_2O_3$, $TiO_2$, $HfO_2$, PZT, PLZT, and SBT. The dielectric film is formed by depositing the high dielectric oxide film on a surface while exposing the high dielectric oxide film during formation thereof to a concentration of atomic oxygen sufficient for reducing oxygen vacancies therein and sufficient to eliminate a post-formation oxygen anneal of the high dielectric oxide film. In one embodiment of the high dielectric oxide film, the film is deposited on an electrode of a capacitor in a semiconductor memory device.

DETAILED DESCRIPTION OF THE EMBODIMENTS

The present invention shall be described with reference to FIGS. 1 and 2. Thereafter, additional embodiments of the present invention shall be further described with reference to FIGS. 3–5.

Figure 1:
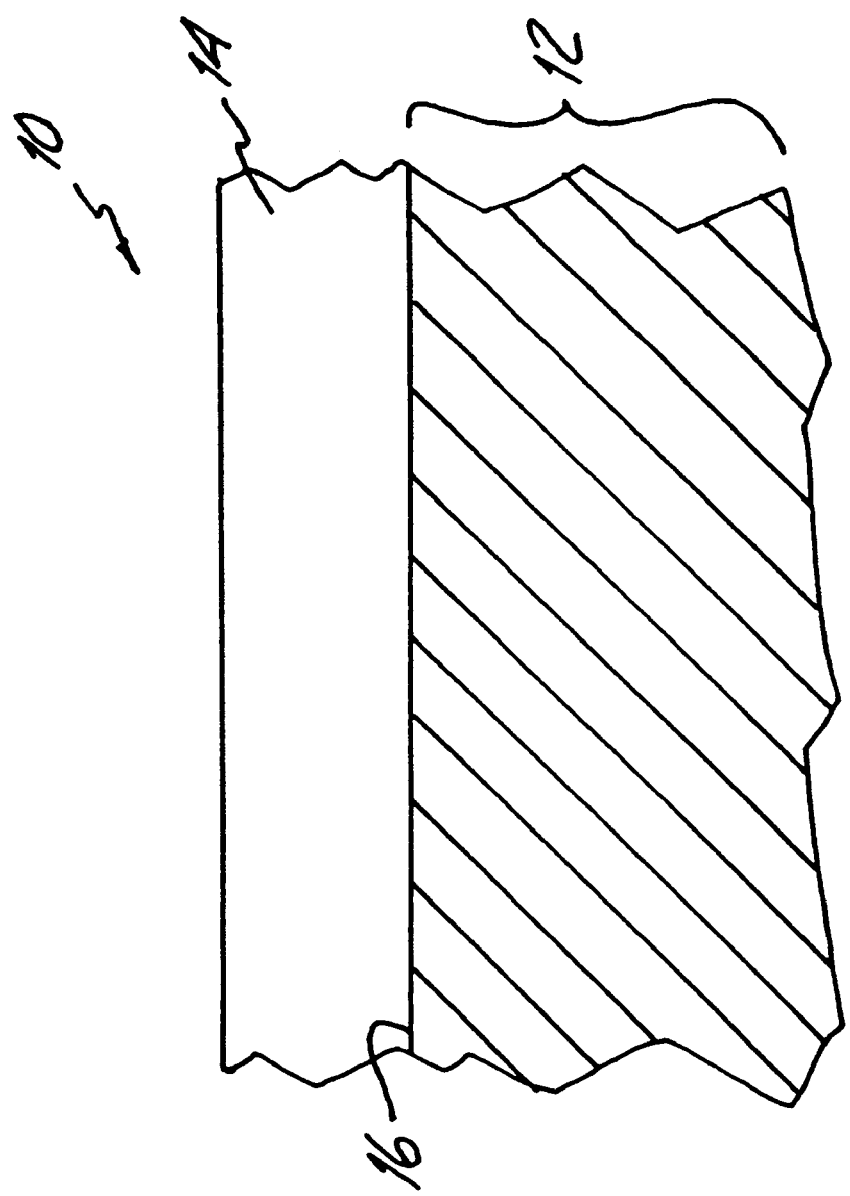
FIG. 1 is a general illustration of a portion of a device structure including a high dielectric oxide film formed in accordance with the present invention.

FIG. 1 is an illustration of a portion 10 of a device structure, such as a portion of a capacitor, gate dielectric, or other device structure, which includes a high dielectric film 14. For example, the device structure may be a portion of a memory device, such as a dynamic random access memory. As shown in FIG. 1, the portion 10 includes a layer or film 12 of the device structure 10 having a surface 16. The layer or film 12 can be any material utilized in the fabrication of semiconductor devices. For example, if the device structure is a random access memory and the portion 10 is part of a capacitor, the layer 12 is an electrode. Such an electrode may be either a smooth or a rugged electrode and, further, the electrode may be of any conducting material, such as a metal, a semiconductor, a semi-metal, or any combination thereof, i.e., a stack containing one or more such electrode materials. For example, $Ta_2O_5$ deposition using a $TaF_5$ precursor may be formed on polysilicon, crystalline silicon, hemispherical grain polysilicon, germanium, or silicon-germanium, $WSi_x$, or TiN. Such electrodes may be treated by rapid thermal anneal in an oxygen and/or nitrogen atmosphere. After formation of the high dielectric film, a top electrode is formed as part of the capacitor as known to one skilled in the art. Further, for example, if the portion 10 of the device structure is representative of a gate region, the layer or film 12 may be representative of a semiconductor substrate, such as silicon. Semiconductor substrate refers to the base semiconductor layer, e.g., the lowest layer of silicon material on a wafer or a silicon layer deposited on another material such as silicon on sapphire. The term "semiconductor substrate assembly" refers to a part of a device structure including a semiconductor substrate having one or more layers, films or structures formed thereon.

The portion 10 of the device structure further includes a high dielectric oxide film 14 formed on surface 16 of the layer or film 12 in accordance with the present invention. The high dielectric oxide film 14 may include any film having a dielectric constant ($\in$) greater than about 4. For example, the high dielectric oxide film 14 may be $Ta_2O_5$, $Ba_xSr_{1-x}TiO_3$, $SrTiO_3$, $Y_2O_3$, $TiO_2$, $HfO_2$, PZT (lead zirconate titanate), PLZT (lanthanum-doped lead zirconate titanate), SBT (strontium bismuth titanate), BST (barium strontium titanate), or any other high dielectric oxide film formed with a low oxygen content such that oxygen vacancies therein are present when such films are formed utilizing conventional formation methods. For example, such conventional formation methods include high dielectric formation methods using $O_2$ as a source gas and many of which require post-deposition anneals in an oxygen ambient in order to eliminate or reduce these vacancies. Such oxygen vacancies using current deposition methods result in higher than normal leakage current levels for such high dielectric oxide films. For example, such oxygen vacancies are a result of the impurities carbon and hydrogen remaining in the film after deposition thereof.

The high dielectric oxide film 14 formed in accordance with the present invention eliminates the oxygen vacancies during the formation of the high dielectric oxide film 14. In other words, the film 14 undergoes an in situ oxygen anneal simultaneously with the formation of the film. Atomic oxygen is utilized during formation of the high dielectric oxide film to fill the oxygen vacancies as the film is formed. Such elimination of the oxygen vacancies produces a high dielectric oxide film which is more stoichiometric and impurity-free and therefore has lower leakage current levels. Excess atomic oxygen is incorporated into the high dielectric oxide film during formation thereof through the use of atomic oxygen containing sources such as $O_3$, $N_2O$, NO, as well as atomic oxygen provided in other manners as described below. The atomic oxygen is incorporated into the film in a concentration sufficient to eliminate the need for post-formation oxygen anneals, as typically required in conventional deposition of such high dielectric oxide films. By eliminating or reducing the need for post-formation oxygen anneals through the use of an in situ oxygen anneal in accordance with the present invention, throughput is increased and a reduced thermal budget is achieved.

In addition, the high dielectric oxide film 14 may be part of a stack of other dielectric films, i.e., a stack of one or more of $Ta_2O_5$, $TiO_2$, or $Si_3N_4$. In such a configuration, an anneal of all the layers may still be necessary to reduce the leakage current depending upon the films utilized in such a stack.

Although the present invention is particularly described with respect to the formation of a $Ta_2O_5$ high dielectric oxide film, other high dielectric constant oxide films have similar leakage current level problems. The present invention is therefore beneficial not only for the $Ta_2O_5$ film, but for any other such high dielectric oxide film having oxygen vacancies or low oxygen content when formed in conventional manners. Therefore, the present invention is not limited to the $Ta_2O_5$ film but is limited only in accordance with the present invention as described in the accompanying claims.

The method of forming the high dielectric oxide film 14 in accordance with the present invention shall be described with reference to the apparatus 20 shown in FIG. 2. Apparatus 20 includes process chamber 22 and a device structure 15 located therein on device structure holder 17. The process chamber 22 further includes vacuum pump 24 for evacuating the chamber and a heat source 26, such as an ultraviolet (UV) or microwave radiation source directed into the process chamber 22 for use in providing atomic oxygen using ozone, i.e., for example, UV ozone treatment. The process chamber 22 may be any conventional chamber utilized for the formation of films in the fabrication of semiconductor devices. For example, the process chamber 22 is representative of various CVD process chambers including, but not limited to, hot wall or cold wall reactors, atmospheric or reduced pressure reactors, as well as plasma enhanced reactors. Therefore, the present invention contemplates deposition of the films in accordance with the present invention utilizing low pressure CVD (LPCVD), physical vapor deposition (PVD), plasma enhanced CVD (PECVD), and reduced thermal CVD (RTCVD). Further, the present invention may be applicable or used with other sputtering processes for forming high dielectric oxide films.

Apparatus 20 for depositing the high dielectric oxide film 14 further includes controllable atomic oxygen source 27 and controllable vaporized precursor source 29. Controllable atomic oxygen source 27 includes atomic oxygen source 28 and a mass flow controller 32. The mass flow controller 32 may be any commercially available flow controller utilized for controlling a gas flow. The mass flow controller 32 controls the flow of atomic oxygen from atomic oxygen source 28 via gas line 40 into the process chamber 22. Atomic oxygen source 28 may include any atomic oxygen containing source, such as $O_3$, $N_2O$, NO, or any combination thereof.

Figure 2:
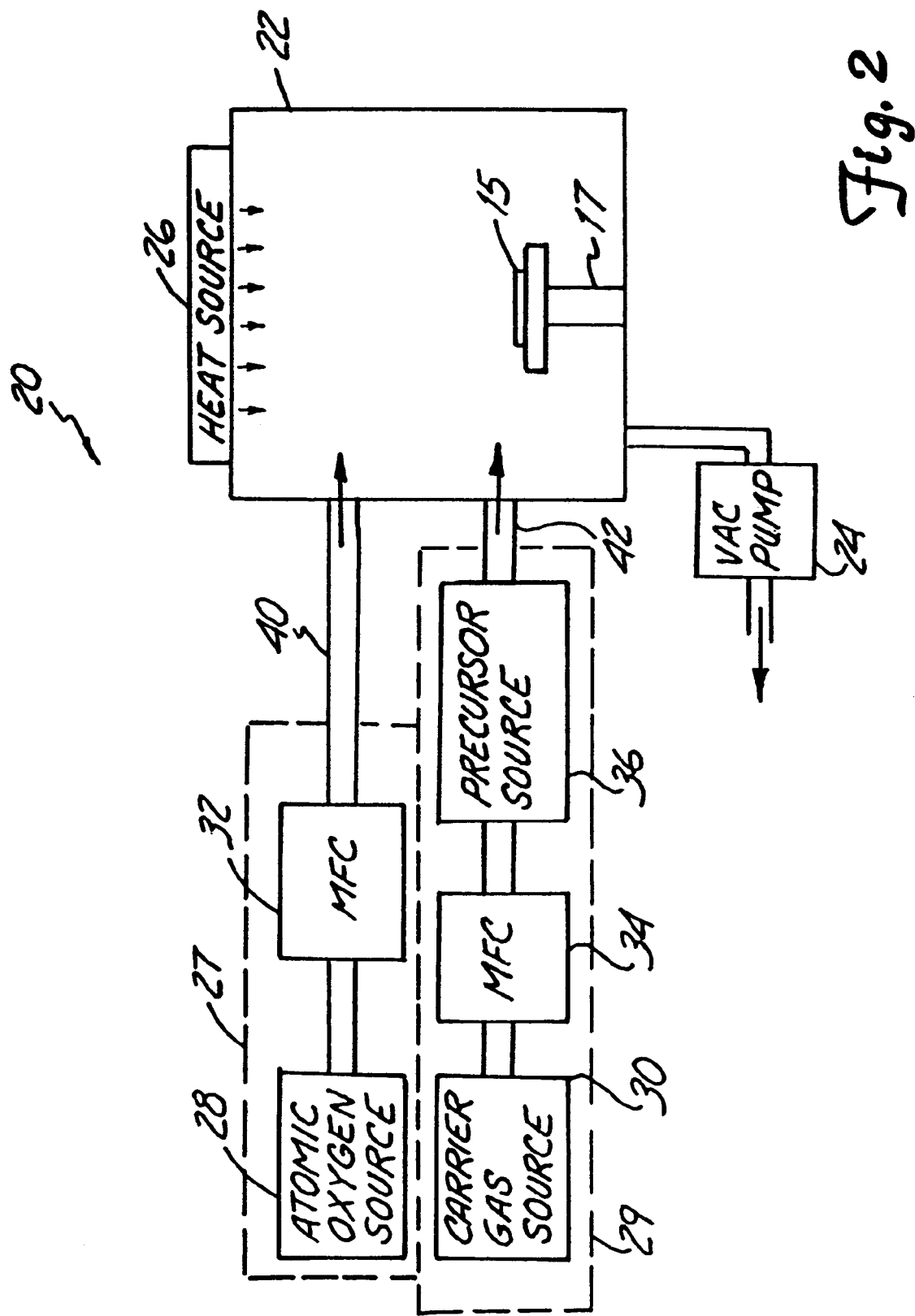
FIG. 2 is a block illustration of an apparatus for use in depositing high dielectric oxide films in accordance with the present invention.

The controllable vaporized precursor source 29, at least in the embodiment shown in FIG. 2, includes carrier gas source 30, mass flow controller 34, and precursor source 36. The mass flow controller 34, which may be any flow controller for controlling gas flow, is utilized to control the flow of an inert gas such as, for example, Ar, $N_2$, He, $H_2$, $N_2O$, NO, provided from carrier gas source 30. The carrier gas utilized is used to generate and/or move vaporized precursor from precursor source 36 through gas line 42 into the process chamber 22.

Although the controlled vaporized precursor source 29 is shown to include carrier gas source 30, mass flow controller 34, and precursor source 36, the controllable vaporized precursor source 29 may be of any configuration suitable for providing one or more vaporized precursors for formation of the desired high dielectric oxide film into process chamber 22. For example, the controlled vaporized precursor source 29 may include a liquid source or a solid source vaporized in any particular manner including, but in no manner limited to, solid sublimation, bubbler delivery, flash vaporization of solid particles or microdroplets.

For example, solid precursors utilized may include $TaF_5$, $TaCl_5$, or other tantalum halides for depositing $Ta_2O_5$. Other nonorganic solid precursors are also available for forming BST, PZT, PLZT, etc. Liquid precursors utilized may include $Ta(OC_2H_5)_5$ or any other organometallic liquids containing tantalum for forming $Ta_2O_5$. However, any vaporized precursor suitable for use in forming the desired high dielectric film 14 in process chamber 22 may be utilized.

In accordance with the present invention, the controllable atomic oxygen source 27 provides an excess of atomic oxygen during formation of the high dielectric oxide film typically having oxygen vacancies and higher leakage current levels. As such, the high dielectric oxide film 14 is then formed with oxygen vacancies being filled as the high dielectric oxide film 14 is formed. The concentration or amount of atomic oxygen necessary in the process chamber 22 depends upon the type of high dielectric film 14 being formed.

One skilled in the art will recognize that the deposition process may be performed in either single wafer or batch type systems. Further, it should be apparent that the deposition process may be clustered with an in situ preclean and/or a post deposition conditioning chamber, i.e., for example, ultraviolet ozone conditioning, $O_3$ plasma conditioning, dry oxidation in $O_2$, $O_3$, $N_2O$, or NO conditioning.

As one illustrative embodiment of the present invention, the apparatus 20 may be similar to the cold wall type LPCVD apparatus as described in the article entitled, "Leakage Current Mechanisms of Amorphous and Polycrystalline $Ta_2O_5$ Films Grown by Chemical Vapor Deposition," by Aoyama et al., *J. Electrochem. Soc.*, Vol. 143, No. 3, March 1996 which is incorporated in its entirety herein by reference thereto. The controllable atomic oxygen source 27 may include any of the oxygen containing species described above or any combination thereof. The controllable vaporized precursor source 29 may, for example, in the deposition of a $Ta_2O_5$ film include a liquid precursor source 36 of $Ta(OC_2H_5)_5$ with the mass flow controller 34 controlling an argon carrier gas for bubbling through the liquid precursor source 36 providing a vaporized precursor or reactant gas for deposition of $Ta_2O_5$ utilizing the process chamber 22. For example, argon gas is introduced into the $Ta(OC_2H_5)_5$ liquid maintained at about 160° C. The atomic oxygen and the $Ta(OC_2H_5)_5$ with argon carrier are then introduced simultaneously into the reaction chamber through gas lines which are heated to 180° C. In the cold wall chamber, the substrate is heated to, for example, 400° C. and the film formed may be amorphous, crystalline, or polycrystalline depending upon other parameters of the deposition apparatus. For example, temperature and pressure changes may produce an amorphous film as opposed to a partially crystalline or crystalline film. The present invention is in no manner limited to any particular structural configuration for the film, such as amorphous or polycrystalline, but is limited only in accordance with the present claims. Further, various pressures, temperatures, and other deposition process parameters may be utilized to generate the desired film in accordance with the present invention and the present invention is not limited to any particular process parameters.

$Ta_2O_5$ films are typically deposited by LPCVD or PECVD using an organometallic precursor such as the $Ta(OC_2H_5)_5$ which has a fairly low vapor pressure of about 200 m Torr at 85° C. The LPCVD process leads to extremely good step coverage and makes the process viable for memory cell dielectric formation. However, during this process a large amount of carbon is incorporated into the dielectric film. The carbon comes from the precursor and results in higher leakage currents for the films conventionally deposited. In situ incorporation of atomic oxygen during the formation of the dielectric film as described above reduces the leakage current. However, to further provide additional advantage by lowering the carbon level and still providing excellent step coverage, the combination of a solid carbon-free or nonorganic precursor, with in situ incorporation of atomic oxygen, is utilized as described below.

For example, in the deposition of $Ta_2O_5$, a LPCVD process can be performed utilizing a solid carbon-free precursor such as $TaF_5$, $TaCl_5$, or other tantalum halides along with atomic oxygen incorporation as described herein. The LPCVD process may be performed at a deposition pressure of about 25 m Torr to about 10 Torr and at a temperature of about 250° C. to about 700° C. The solid precursor can be vaporized and provided to the deposition chamber in various manners, such as for example, heating a $TaF_5$ solid source to greater than about 70° C. and then transferring the vaporized precursor to the deposition chamber using a carrier gas such as, for example, Ar, $N_2$, He, $H_2$, $N_2O$, or NO. The atomic oxygen, or oxygen source, can then be provided using $O_3$, $N_2O$, NO, $O_2$ or any combination thereof and in any manner described herein.

Figure 3:
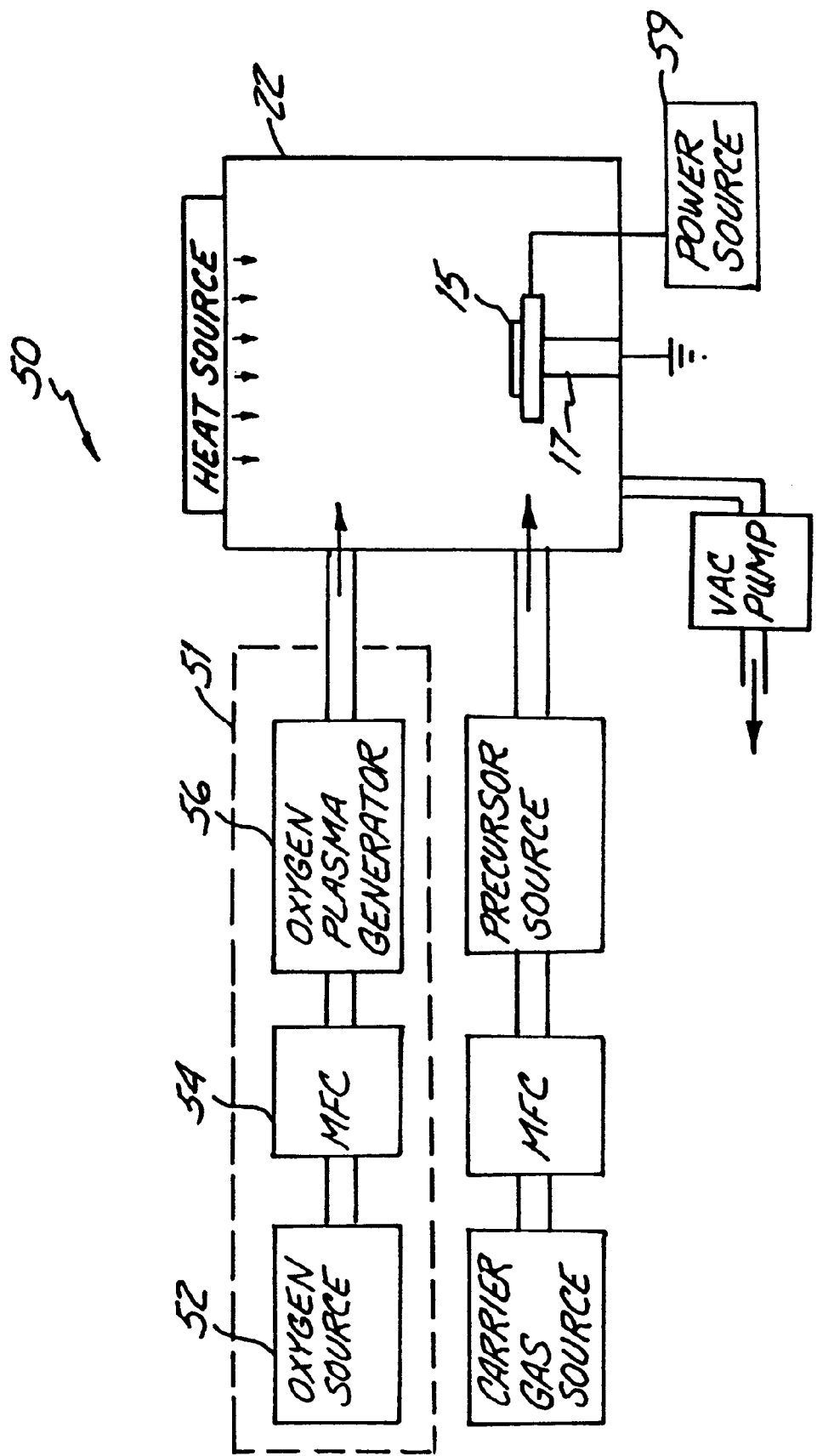
FIG. 3 is a block illustration of an alternate configuration of the apparatus of FIG. 2 in accordance with the present invention.

FIG. 3 is an alternate configuration of an apparatus 50 for forming the high dielectric oxide film 14 in accordance with the present invention. The apparatus 50 includes substantially the same elements or components as the apparatus 20 described with reference to FIG. 2. However, the controlled atomic oxygen source 27 is replaced with controlled atomic oxygen source 51. The controlled atomic oxygen source 51 includes an oxygen source 52, a mass flow controller 54, and an oxygen plasma generator 56. In this particular configuration, the atomic oxygen is provided to the process chamber from the oxygen plasma generator 56. The oxygen plasma generator 56 functions as an atomic oxygen source by generating a plasma from the oxygen containing source 52. The oxygen plasma generator 56 may be remote from the process chamber 22 as shown in FIG. 3, or may be such as to provide a plasma in proximity to the device structure 15, i.e., in the process chamber with the wafer.

Oxygen source 52 may include $O_3$, $N_2O$, NO, $O_2$ or any combination thereof. The oxygen containing source 52 is provided to the oxygen plasma generator 56 by any commercially available mass flow controller 54. For example, an oxygen plasma may be generated utilizing an $O_2$ source provided to a 13.56 MHz RF generator at a pressure of 0.3 torr, a temperature of 400° C., and an RF power of 0.35 $W/cm^2$. It should be readily apparent that the parameters for the oxygen plasma generator are dependent upon the oxygen containing source utilized and the amount of atomic oxygen to be delivered to the process chamber. Various pressures, temperatures, power levels and generators may be utilized to generate the oxygen plasma and the present invention is not limited to any particular configuration for generating the oxygen plasma.

Also shown in FIG. 3 is a power source 59 for biasing the device structure 15 on device structure holder 17. With bias applied to the device structure 15, ionized atomic oxygen generated by the plasma generator 56 is attracted thereto and oxygen vacancies in the high dielectric oxide film 14 are filled more quickly by the ionized atomic oxygen provided in the process chamber 22. For example, but in no manner limited to the present invention, the power source may be ±50 volts DC.

It would be readily apparent to one skilled in the art that a combination of a plasma source 51 such as shown in FIG. 3 and an atomic oxygen source 28 such as shown in FIG. 2 may be used in combination to provide the necessary atomic oxygen in the process chamber 22.

Figure 4:
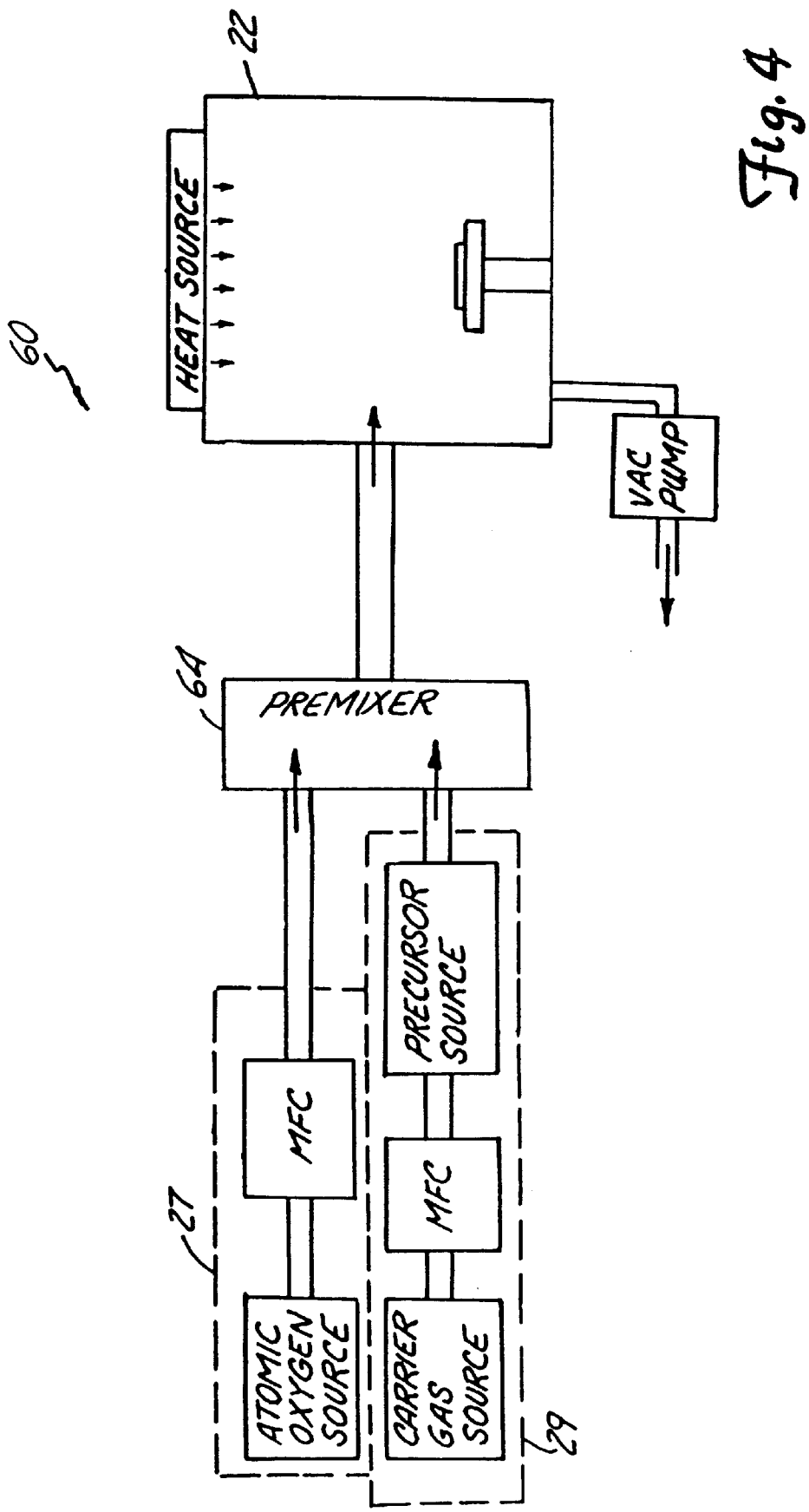
FIG. 4 is a block illustration of an alternate configuration of the apparatus of FIG. 2 in accordance with the present invention.

Another alternate configuration of an apparatus 60 for forming the high dielectric oxide film 14 shall be described with reference to FIG. 4. FIG. 4 is substantially equivalent to the apparatus 20 as shown in FIG. 2. However, the apparatus 60 further includes a premixer unit 64 such that the vaporized precursor and the atomic oxygen provided by the controlled atomic oxygen source 27 and the controlled vaporized precursor source 29 are premixed in the premixer unit 64 prior to transfer into the process chamber 22. In such a manner, the atomic oxygen may be more evenly distributed in the vaporized precursor such that a more efficient filling of the oxygen vacancies typically contained in the high dielectric oxide film 14 are filled. It should be readily apparent that the premixer 64 may also be utilized with the atomic oxygen provided from the oxygen plasma generator 56 in the alternate configuration shown in FIG. 3.

Figure 5:
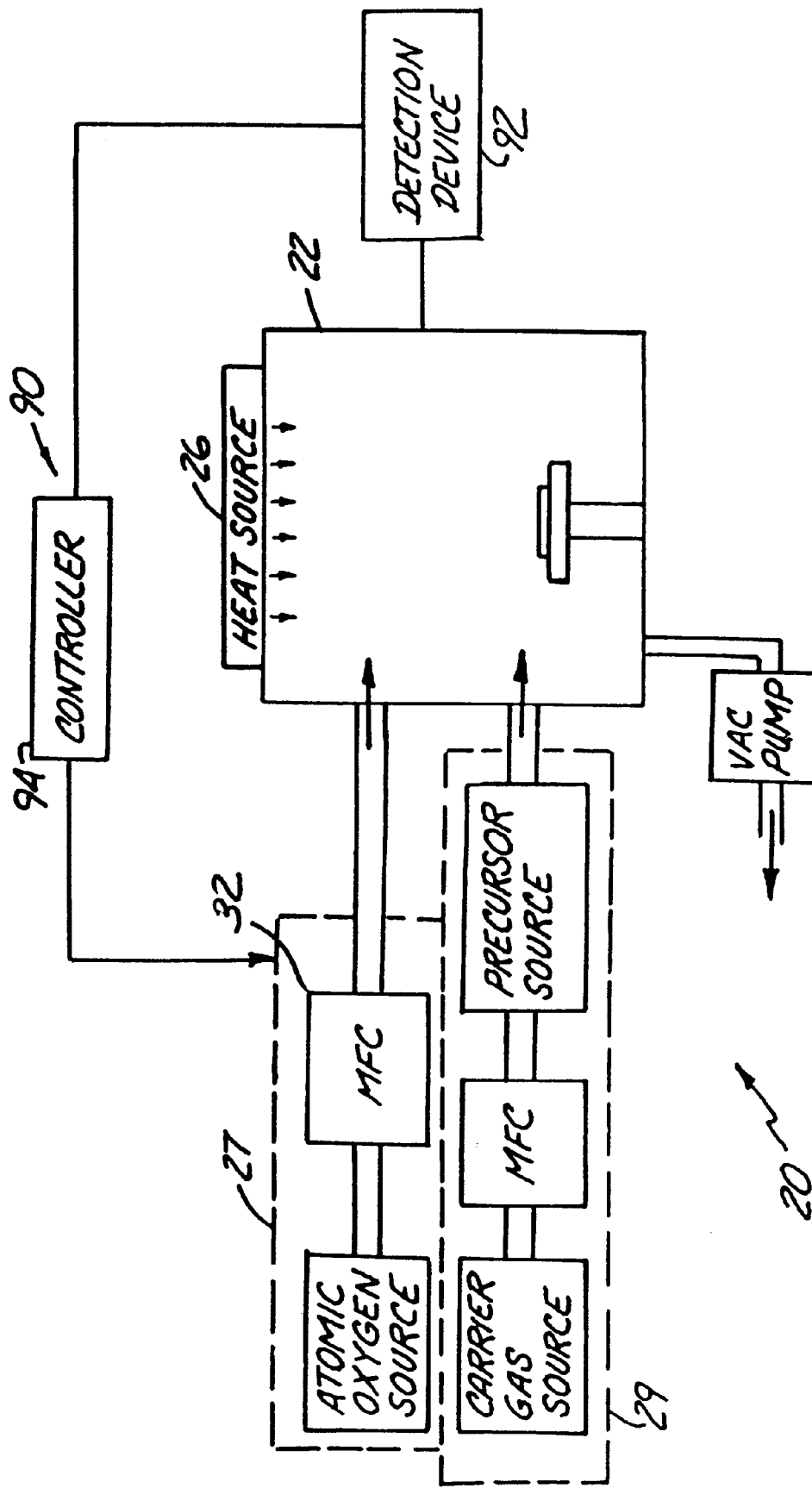
FIG. 5 is an alternate configuration of the apparatus as shown in FIG. 2, further including a detection and control mechanism in accordance with the present invention.

FIG. 5 shows the apparatus 20 for forming the high dielectric oxide film 14 in accordance with the present invention and, in addition, a block illustration of a detection and control apparatus 90 for maintaining a desired atomic oxygen concentration in the processing chamber 22. The detection and control apparatus 90 includes a detection device 92 and a controller 94.

The controller 94 may be any controller apparatus, such as a processing unit and software associated therewith, or a control logic circuit for generating a command output to the controlled atomic oxygen source 27 for controlling the concentration of atomic oxygen in processing chamber 22. The command output to the controlled atomic oxygen source 27 is generated by the controller 94 in response to a signal generated by detection device 92 based on a characteristic of the formation process of the high dielectric oxide film 14. The controller 94 is in no manner limited to any processor, any particular logic or software, or any particular configuration but is limited only as defined in the accompanying claims.

Detection device 92 may be any apparatus for sensing a parameter of a high dielectric film formation process characteristic of the filling of oxygen vacancies within the high dielectric oxide film 14 being formed. For example, detection device 92 may be for detecting the concentration of atomic oxygen in the processing chamber 22. Further, for example, the detection device 92 may be for detecting the amount of oxygen incorporated in the high dielectric oxide film 14, and thus representative of the number of vacancies within the film filled so as to reduce the leakage current of the film 14.

The detection and control apparatus 90, for example, may be any apparatus for performing ellipsometry utilizing a light source directed at the surface of the device structure 15 and a detector for detecting the reflected light therefrom. The reflected light is utilized to determine the amount of oxygen incorporated in the high dielectric oxide film being formed. As a function of the detected reflective light, the controller 94 with the appropriate spectroscopic software can determine the oxygen content and generate a command for control of, for example, the mass flow controller 32 in order to increase or decrease the atomic oxygen in the processing chamber 22.

Further, for example, the detection and control apparatus 90 may include an apparatus for performing Raman spectroscopy which may be utilized to determine the amount of oxygen incorporated in the high dielectric oxide film 14 and further utilized to determine the structure of the film, i.e., whether the film is amorphous or crystalline. With use of the detected scattered light and the appropriate Raman spectroscopy software, a command signal may be generated to control the atomic oxygen as previously described or, further, may be utilized to control any other parameter of the apparatus 20 such that the structure of the film is controlled as oxygen vacancies in the film are filled.

In a further example, the concentration of the atomic oxygen in the processing chamber may be detected as opposed to the oxygen in the high dielectric oxide film 14. For example, a commercially available residual gas analyzer may be utilized. Such an analyzer typically includes a light source for generating light for impingement on the materials in the process chamber 22. A detector of the analyzer may then detect the scattered light and provide an output signal which can be analyzed by the appropriate spectroscopic software to determine oxygen concentration in the processing chamber 22. The controlled atomic oxygen source 27 may then be controlled as a function of the amount of atomic oxygen detected in the processing chamber 22.

It would be readily apparent to one skilled in the art that detection and control apparatus 90 may include any of the devices described above or a combination thereof. Further, other spectroscopic detection devices or gas analysis devices typically utilized for detecting concentrations and structures in films and in sample containers may be utilized in conjunction with the present invention. The present invention is not limited to those listed herein, but is limited only as described in the accompanying claims.

Although the present invention has been described with particular reference to various embodiments thereof, variations and modifications of the present invention can be made within a contemplated scope of the following claims, as is readily known to one skilled in the art.

What is claimed is:

1. A method of forming a high dielectric oxide film, the method comprising:
    depositing a high dielectric oxide film on a surface of a device structure provided in a process chamber, the high dielectric oxide film having a dielectric constant greater than about 4 and including a plurality of oxygen vacancies formed during deposition of the high dielectric oxide film; and
    exposing the high dielectric oxide film during deposition to an amount of atomic oxygen that reduces the plurality of oxygen vacancies to eliminate a post deposition oxygen anneal of the high dielectric oxide film, wherein the atomic oxygen utilized for exposure is provided by generation of a plasma from at least one of $O_2$, $O_3$, NO, and $N_2O$, wherein the generation of the plasma is performed remotely from the process chamber, and further wherein the amount of atomic oxygen to which the high dielectric oxide film is exposed during deposition thereof is controlled as a function of the amount of oxygen incorporated into the high dielectric oxide film during the deposition thereof.

2. The method according to claim 1, wherein the surface is biased for attracting ionized atomic oxygen of the plasma.

3. The method according to claim 1, wherein the atomic oxygen is exposed to a heat source.

4. The method according to claim 1, wherein the high dielectric film includes one of $Ta_2O_5$, $Ba_xSr_{1-x}TiO_3$, $Y_2O_3$, $TiO_2$, $HfO_2$, PZT, PLZT, and SBT.

5. The method according to claim 1, wherein the high dielectric oxide film comprises a $Ta_2O_5$ film.

6. The method according to claim 5, wherein depositing the high dielectric oxide film further comprises providing a vaporized tantalum precursor for use in the deposition of the $Ta_2O_5$ film.

7. The method according to claim 6, wherein depositing the high dielectric oxide film further comprises depositing the $Ta_2O_5$ film using the atomic oxygen and the vaporized tantalum precursor simultaneously while simultaneously performing an in situ oxygen anneal of the $Ta_2O_5$ film.

8. The method according to claim 6, wherein providing a vaporized tantalum precursor comprises vaporization of a carbon-free solid precursor.

9. A method of forming a high dielectric oxide film, the method comprising:
    depositing a high dielectric oxide film on a surface of a device structure provided in a process chamber, the high dielectric oxide film having a dielectric constant greater than about 4 and including a plurality of oxygen vacancies formed during deposition of the high dielectric oxide film; and
    exposing the high dielectric oxide film during deposition to an amount of atomic oxygen that reduces the plurality of oxygen vacancies to eliminate a post deposition oxygen anneal of the high dielectric oxide film, wherein the atomic oxygen utilized for exposure is provided by generation of a plasma from at least one of $O_2$, $O_3$, NO, and $N_2O$, wherein the generation of the plasma is performed remotely from the process chamber, and further wherein the amount of atomic oxygen to which the high dielectric oxide film is exposed during deposition thereof is controlled as a function of a concentration of atomic oxygen in the process chamber used for deposition of the high dielectric oxide film.

10. The method according to claim 9, wherein the surface is biased for attracting ionized atomic oxygen of the plasma.

11. The method according to claim 9, wherein the atomic oxygen is exposed to a heat source.

12. The method according to claim 9, wherein the high dielectric film includes one of $Ta_2O_3$, $Ba_xSr_{1-x}TiO_3$, $Y_2O_3$, TiO, $HfO_2$, PZT, PLZT, and SBT.

13. The method according to claim 9, wherein the high dielectric oxide film comprises a $Ta_2O_5$ film.

14. The method according to claim 13, wherein depositing the high dielectric oxide film further comprises providing a vaporized tantalum precursor for use in the deposition of the $Ta_2O_5$ film.

15. The method according to claim 14, wherein depositing the high dielectric oxide film further comprises depositing the $Ta_2O_5$ film using the atomic oxygen and the vaporized tantalum precursor simultaneously while simultaneously performing an in situ oxygen anneal of the $Ta_2O_5$ film.

16. The method according to claim 14, wherein providing a vaporized tantalum precursor comprises vaporization of a carbon-free solid precursor.

* * * * *